(12) United States Patent
Wang et al.

(10) Patent No.: US 8,698,267 B2
(45) Date of Patent: Apr. 15, 2014

(54) ELECTRODE AND FABRICATING METHOD THEREOF

(75) Inventors: Yang Wang, Guangdong (CN); Krzysztof Kempa, Guangdong (CN); Zhifeng Ren, Guangdong (CN)

(73) Assignee: South China Normal University (CN)

( * ) Notice: Subject to any disclaimer, the term of this patent is extended or adjusted under 35 U.S.C. 154(b) by 4 days.

(21) Appl. No.: 13/503,903

(22) PCT Filed: Sep. 8, 2011

(86) PCT No.: PCT/CN2011/079481
§ 371 (c)(1),
(2), (4) Date: Apr. 25, 2012

(87) PCT Pub. No.: WO2012/055302
PCT Pub. Date: May 3, 2012

(65) Prior Publication Data
US 2012/0273915 A1  Nov. 1, 2012

(51) Int. Cl.
*H01L 31/107* (2006.01)
*H01L 31/0232* (2006.01)

(52) U.S. Cl.
USPC ............ 257/436; 257/448; 257/459; 257/461

(58) Field of Classification Search
CPC ............. H01L 31/02167; H01L 31/022425; H01L 31/0522
USPC .................... 257/436, 448, 459, 461
See application file for complete search history.

(56) References Cited

U.S. PATENT DOCUMENTS

| | | | |
|---|---|---|---|
| 7,373,034 B2 * | 5/2008 | Shimizu et al. | 385/14 |
| 2009/0079322 A1 | 3/2009 | Tsutsumi et al. | |
| 2009/0091500 A1 * | 4/2009 | Haziza | 343/700 MS |
| 2010/0175749 A1 | 7/2010 | Tsutsumi et al. | |

FOREIGN PATENT DOCUMENTS

| | | |
|---|---|---|
| CN | 101393779 A | 3/2009 |
| EP | 2 040 303 A2 | 3/2009 |

* cited by examiner

*Primary Examiner* — Ngan Ngo
(74) *Attorney, Agent, or Firm* — DLA Piper LLP (US)

(57) ABSTRACT

An electrode includes a substantially planar metallic thin film layer with a patterned structure including a plurality of parallel lines or a plurality of crossed lines, the metallic thin film layer configured to transmit an incident light through the metallic thin film layer.

11 Claims, 13 Drawing Sheets

ELECTRODE AND FABRICATING METHOD THEREOF

RELATED APPLICATIONS

This is a §371 of International Application No. PCT/CN2011/079481, with an international filing date of Sep. 8, 2011, which is based on Chinese Patent Application No. 201010524934.7, filed Oct. 29, 2010, the subject matter of which is incorporated by reference.

TECHNICAL FIELD

This disclosure relates to fields of photovoltaic applications and optoelectronic applications and, more particularly, to an electrode for photovoltaic applications or optoelectronic applications and a fabricating method thereof.

BACKGROUND

As society advances, traditional energy sources such as petroleum and coal are decreasing in storage, solar energy is getting more and more attention as an alternative of traditional energy sources. In photovoltaic applications, solar cells are key elements in photoelectric technology for directly converting sunlight into electric energy, and are widely employed in applications from those for universe to home.

The core of a solar cell is P-N junction. Electron-hole pairs are generated when sunlight with energy higher than a semiconductor's band gap energy is incident on the P-N junction of a solar cell. With the electric field generated on the P-N junction, electrons are transported to an N layer, and holes are transported to a P layer at the same time, thereby resulting in a photoelectric effect between the P and N layers. When two terminals of the solar cell are connected to a load or system, electric energy in the form of current is generated.

Solar cells are classified into various types in terms of materials for forming intrinsic layers, i.e., light absorption layers. Generally, silicon solar cells with intrinsic layers made from silicon are the most common type. There are two types of silicon solar cells nowadays: crystal (single-crystalline or polycrystalline) solar cells and film (amorphous or microcrystalline) solar cells. In addition to these two types of solar cells, there are cadmium-telluride or copper-indium-selenium (CIS, CuInSe$_2$) compound film solar cells, III-V materials based solar cells, dye-sensitized solar cells and organic solar cells, etc.

Solar cells with a single-crystalline silicon substrate have significantly higher conversion efficiency compared to other types of solar cells. However, their fatal defect is a high fabricating cost due to use of single-crystalline silicon wafers. While polycrystalline silicon solar cells may be produced with relatively low fabricating cost, however, polycrystalline silicon solar cells and monocrystalline silicon solar cells do not differ significantly since these two types of solar cells are both made from a large amount of raw materials. Therefore, the high price of raw material and complex fabricating process make it difficult to reduce fabricating cost.

As one solution to address the defects of these crystal solar cells, thin film silicon solar cells have obtained much attention because of their very low fabricating cost since they are fabricated by depositing silicon films on glass as the absorption layers. In fact, thin film silicon solar cells may be made 100 times thinner than crystal ones.

Thin film solar cells are fabricated by sequentially performing the following steps: forming a front (back) electrode on a substrate made of glass, forming a semiconductor layer on the front (back) electrode and forming a back (front) electrode on the semiconductor layer.

In prior art solar cell fabricating technology, thick films (on the order of 1 µm) of transparent conductive oxides (TCO) are typically used to make electrodes. Further, a surface of the TCO thick film is textured by an etching process using photolithography, an etching process using anisotropy of a chemical solution or a mechanical etching process to form an uneven surface, thereby trapping a weakly absorbed portion of the solar spectrum. FIG. 1A shows a scanning electron microscope (SEM) image of a solar cell which employs this technology and a schematics view of the solar cell. FIG. 1B shows an image of a µc-Si:H film grown on a textured ZnO film.

In FIG. 1A, gray regions in the SEM image indicate highly textured ZnO:B (boron doped zinc oxide) film. The two black regions indicate two PIN junctions (a-Si:H on the top, and µc-Si:H at the bottom). It is clear from FIG. 1A that the surfaces of both PIN junction films are uneven, resulting in a rough and textured surface of the lower layer. This can be more clearly seen in FIG. 1B. This texture-induced roughness of junction surface has a deleterious influence on junction quality such as a low shunt resistance, a high dark current, a high carrier recombination rate, a low fill factor and a low open circuit voltage and, therefore, lowers the energy conversion efficiency and reliability of the solar cells.

In addition, this light trapping scheme is not efficient in the frequency ranges closely above the band gap energy of the absorber (i.e., near infrared frequencies), causing light in these frequency ranges to be mainly absorbed by the absorber. This forces the use of thick absorbers, which further deteriorates their performance, in particular in the case that the absorption layer is a-Si:H junction, due to the optical radiation induced performance deterioration (SWE, Staebler-Wronski Effect), the junction performance may be further deteriorated. Furthermore, this may result in a long deposition time, in particular in the case that the absorption layer is a µc-Si:H junction.

In addition, deposition of textured TCO films also involves a high temperature and a high cost.

It could therefore be helpful to provide an electrode and a manufacturing method thereof which need not use or use little transparent conductive oxide films while manufacturing the electrode, and doesn't need a piling process, thereby preventing junction quality from deteriorating due to the piled conductive oxide thick film. In addition, it could be helpful to provide for the use of the planar electrode as a window superstrate, thereby allowing for a high quality planar PV junction to be deposited over it.

Furthermore, it could be helpful to provide another electrode and a fabricating method thereof, with which a texturing process for back electrodes is not required when manufacturing solar cells.

SUMMARY

We provide an electrode, including a substantially planar metallic thin film layer with a patterned structure including a plurality of parallel lines or a plurality of crossed lines, the metallic thin film layer configured to transmit an incident light through the metallic thin film layer.

We also provide a method for fabricating an electrode, including depositing organic microspheres on a substrate, etching back the organic microspheres to expose a portion of a surface of the substrate, depositing metal on the microspheres and the exposed substrate surface, and peeling off the microspheres to form a metallic conductive thin film layer with a patterned structure such that the metallic thin film layer is configured to transmit an incident light through the metallic thin film layer.

We further provide an electrode laminated on a light absorption layer, including a planar metallic thin film layer pattern including at least a first micro-strip array with a first size and a first shape, wherein 1) the planar metallic thin film layer pattern is configured to transmit an incident light in a first wavelength range into the light absorption layer, and 2) the first wavelength range is determined at least partly based on the first size and the first shape of the first micro-strip array.

We still further provide a method for fabricating an electrode including depositing a metal layer on a light absorption layer, patterning the metallic layer to form a planar metallic thin film layer pattern including at least a first micro-strip array with a first size and a first shape, wherein 1) the planar metallic thin film layer pattern is configured to transmit an incident light in a first wavelength range into the light absorption layer, and 2) the first wavelength range is determined at least partly based on the first size and the first shape of the first micro-strip array.

BRIEF DESCRIPTION OF THE DRAWINGS

Like reference numerals indicate similar or corresponding features or functions throughout the figures.

DETAILED DESCRIPTION

Figure 1A:
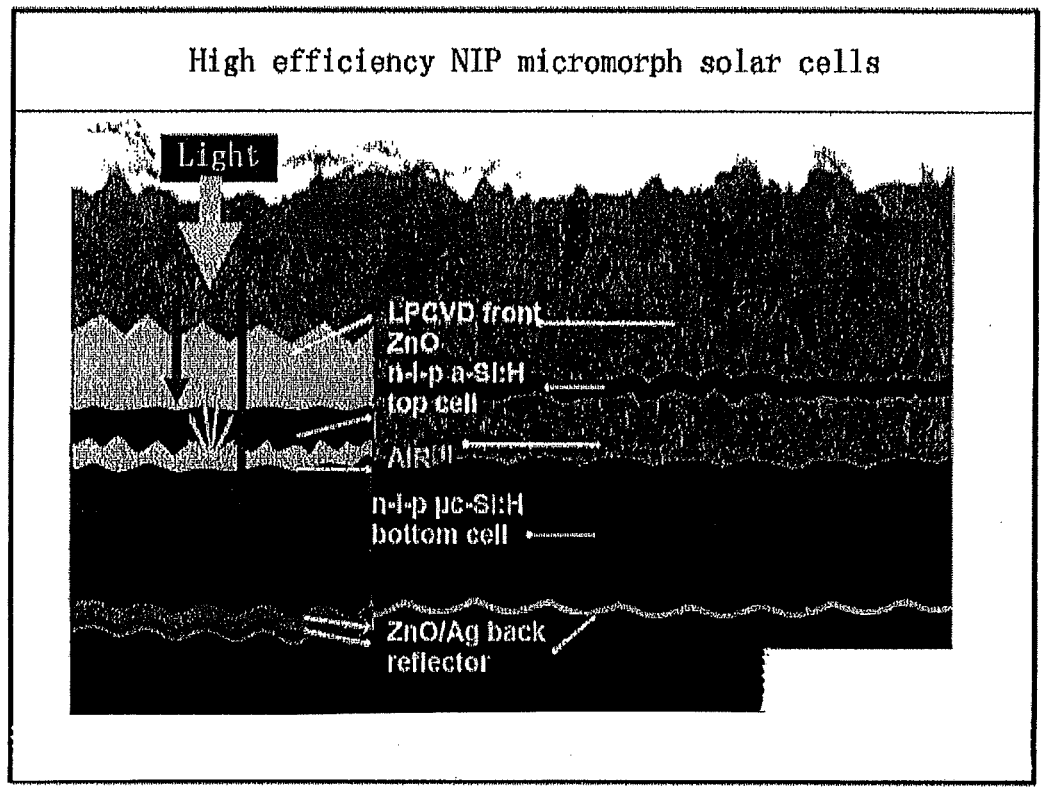
FIG. 1A shows a scanning electron microscope (SEM) image of a solar cell which employs known technology and a schematic view of the solar cell.
Figure 1B:
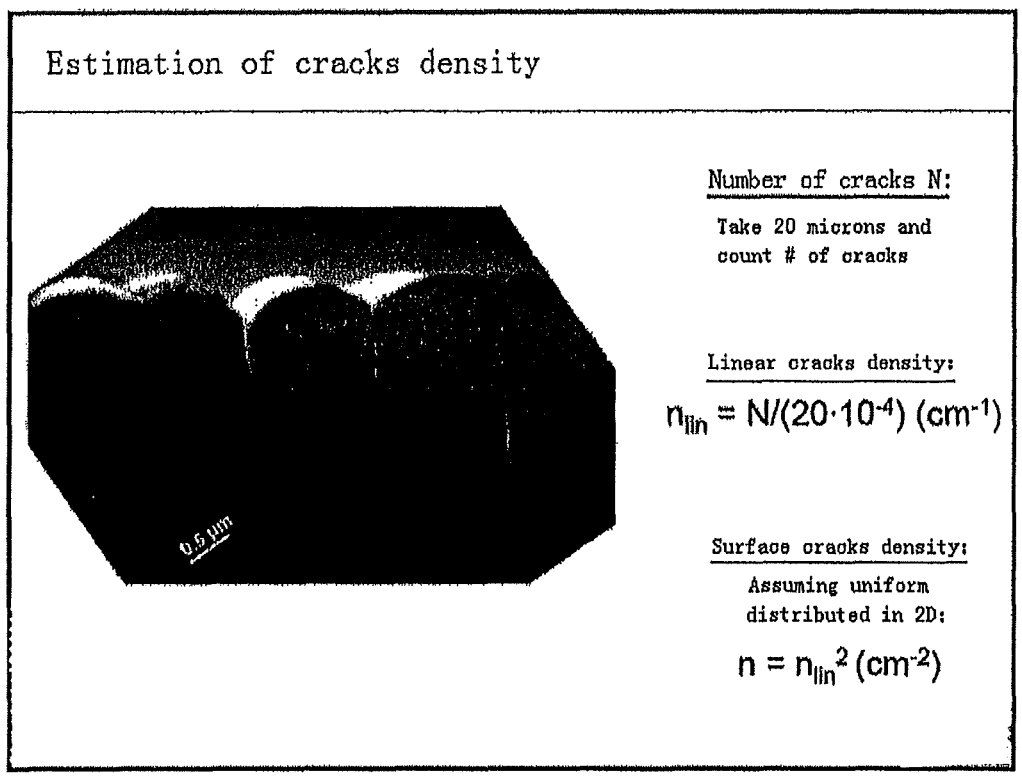
FIG. 1B shows an image of a μc-Si:H film grown on a textured ZnO film.

We provide an electrode, including a substantially planar metallic thin film layer with a patterned structure configured to transmit an incident light through the metallic thin film layer.

Further, the patterned structure may be an Escheric series of patterns.

In one example, the patterned structure may include an array of circular holes. Preferably, circular holes in the array of circular holes may be periodically distributed or randomly distributed.

In another example, the patterned structure may include a plurality of parallel lines. Alternatively, the patterned structure may include a plurality of crossed lines. In one or more examples, the parallel lines or crossed lines may be periodically distributed or randomly distributed.

Further, the metallic thin film layer may be transmittable for a visible light, a near infrared light or an infrared light.

Preferably, the planar metallic thin film layer may have a surface roughness less than 1 μm, 100 nm, 10 nm or 1 nm.

Further, preferably, a material for forming the planar metallic thin film layer may have a resistivity less than 0.005, 0.002 or 0.001 Ω·m.

Further, the metallic thin film layer may be fabricated with a microsphere lithography process. The sheet resistance of the metallic thin film layer may be given by:

$$R_{sq} \approx \frac{\rho}{d}\left(1 - \frac{r}{R}\right)^{-1}$$

wherein, $R_{sq}$ is the sheet resistance of the metallic thin film layer, $\rho$ is resistivity of the material for forming the metallic thin film layer, d is thickness of the metallic thin film layer, R is the radius of the microspheres prior to the microsphere lithography process, and r is the microsphere radius after the microsphere radius reduction.

Preferably, the microspheres may be made from polystyrene, or may be made from inorganic materials such as silicon dioxide.

Preferably, the material for forming the metallic thin film layer is Ag, with d=40 nm, R=220 nm and r=211 nm.

Further, d has a value ranging from 5~1000 nm, R has a value ranging from 10 nm~10 μm, and r<R.

We also provide a method for fabricating an electrode comprising: depositing organic microspheres on a substrate; etching back the organic microspheres to expose a portion of a surface of the substrate; depositing metal on the microspheres and the exposed substrate surface; peeling off the microspheres to form a metallic conductive thin film layer with a patterned structure, wherein the metallic conductive thin film layer is configured to transmit an incident light through the metallic conductive thin film layer.

Further, the patterned structure may include an array of circular holes, a plurality of parallel lines or a plurality of crossed lines.

We further provide an electrode laminated on a light absorption layer comprising a planar metallic thin film layer pattern comprising at least a first micro-strip array with a first size and a first shape, wherein the planar metallic thin film layer pattern is configured to transmit an incident light in a first wavelength range into the light absorption layer, and wherein the first wavelength range is determined at least partly based on the first size and the first shape of the first micro-strip array.

Further, preferably, the planar metallic thin film layer pattern may further include a second micro-strip array with a second size and a second shape, and a third micro-strip array with a third size and a third shape, wherein the planar metallic thin film layer pattern is configured to transmit an incident light in a second wavelength range and an incident light in a third wavelength range into the light absorption layer, and wherein the second wavelength range is determined at least partly based on the second size and the second shape of the second micro-strip array, and the third wavelength range is determined at least partly based on the third size and the third shape of the third micro-strip array.

Further, the light absorption material layer may include a PN junction, a PIN junction or a plurality of junctions.

In one example, the light absorption material may include a photovoltaic material. In another example, the light absorption material may include one of Si, CIGS, CIS, CdTe, GaAs, $Cu_2O$, $Zn_3P_2$ and SiC.

Preferably, the micro-strip may be rectangularly shaped.

Further, the planar metallic thin film layer may have a surface roughness less than 1 μm, 100 nm, 10 nm or 1 nm. The material for forming the planar metallic thin film layer may have a resistivity less than 0.005, 0.002 or 0.001 Ω·m.

Further, the resonance relationship between the wavelength of light transmitted by the micro-strip and the size and shape of the micro-strip may be given as the following:

$$l = s\frac{\lambda}{2n}$$

wherein, l is the strip length, λ is the wavelength of light transmitted by the strips, n is the refractive index of the light absorption material, and s is an arbitrary positive integer.

We still further provide a method for fabricating an electrode comprising: depositing a metal layer on a light absorption layer; patterning the metallic layer to form a planar metallic thin film layer pattern comprising at least a first micro-strip array with a first size and a first shape, wherein the planar metallic thin film layer pattern is configured to transmit an incident light in a first wavelength range into the light absorption layer, and wherein the first wavelength range is determined at least partly based on the first size and the first shape of the first micro-strip array.

Examples will be described in detail below with reference to the drawings. In the following description, for the purpose of explanation, many specific details are set forth for providing a comprehensive understanding of one or more examples. However, it is clear that these examples may be realized without these specific details. In other examples, for the convenience of describing one or more variations, well known structures and devices will be shown in form of block diagrams.

THE FIRST EXAMPLE

An electrode according to a first example may include a substantially planar metallic thin film layer with a patterned structure, and the metallic thin film layer is configured to transmit an incident light through the metallic thin film layer.

Figure 2A:
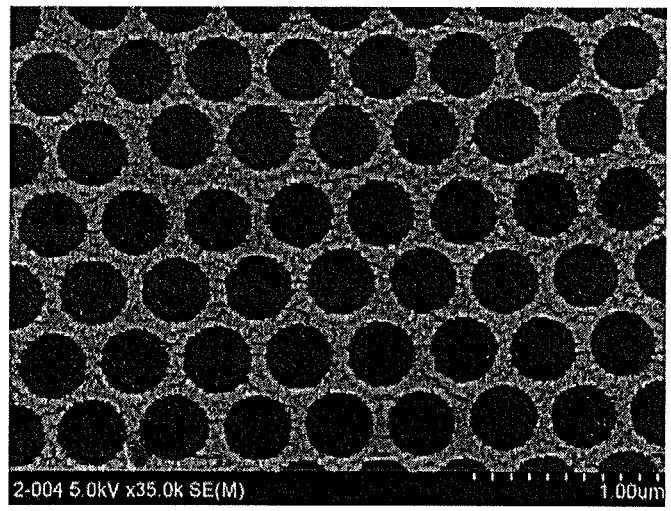
FIG. 2A shows a structure diagram of an electrode sample 1 fabricated with the microsphere photolithographic process, wherein prior to photolithography, the polystyrene spheres have a radius R=220 nm, after processing, the polystyrene spheres have a radius R=170 nm, metal films deposited on the quartz substrate are 3 nm of Cr plus about 25 nm of Au.
Figure 2B:
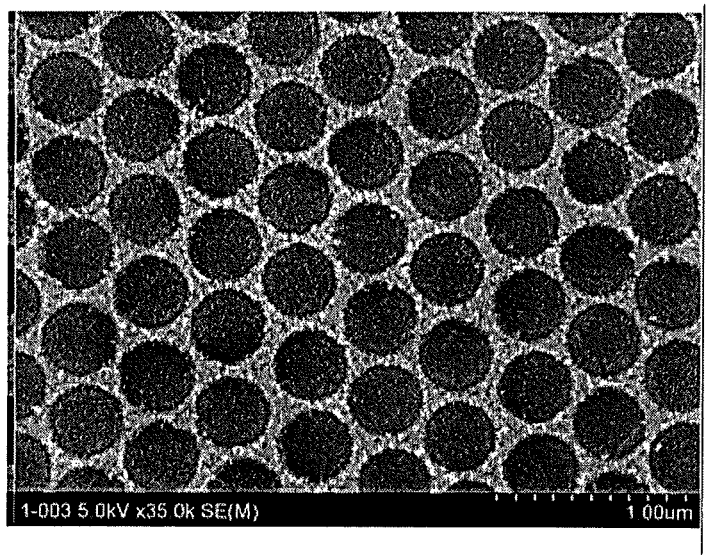
FIG. 2B shows a structure diagram of an electrode sample 2 fabricated with the microsphere photolithographic process, wherein prior to photolithography, the polystyrene spheres have a radius R=220 nm, after processing, the polystyrene spheres have a radius R=192.5 nm, metal films deposited on the quartz substrate are 3 nm of Cr plus about 25 nm of Au.

FIG. 2A shows a structure diagram of the electrode sample 200-1 according to the first example fabricated with the microsphere photolithographic process, wherein prior to photolithography, the polystyrene spheres have a radius R=220 nm, after processing, the polystyrene spheres have a radius R=170 nm, metal films deposited on the quartz substrate are 3 nm of Cr plus about 25 nm of Au. FIG. 2B shows a structure diagram of the electrode sample 200-2 according to the first example fabricated with the microsphere photolithographic process, wherein prior to photolithography, the polystyrene spheres have a radius R=220 nm, after processing, the polystyrene spheres have a radius R=192.5 nm, metal films deposited on the quartz substrate are 3 nm of Cr plus about 25 nm of Au.

As shown in FIGS. 2A and 2B, the metallic thin film layer has a patterned structure of an array of circular holes, and circular holes in the array are regularly distributed in the metallic thin film layer. In another example, circular holes in the array may be randomly distributed in the metallic thin film layer. In addition, it is to be noted that the patterned structure may also be any one of the Escheric series of patterns. In an alternative example, the patterned structure may include a plurality of parallel lines. Alternatively, the patterned structure may include a plurality of crossed lines. Similarly, the parallel lines or crossed lines may be regularly distributed in the metallic thin film layer, or may also be randomly distributed in the metallic thin film layer.

The planar metallic thin film layer with a patterned structure according to the first example may transmit a visible light, a near infrared light or an infrared light, and the transmittance may be 80%, 90%, 95% or higher.

Further, the metallic thin film layer in the electrode according to the first example may preferably have a surface roughness smaller than 1 μm, 100 nm, 10 nm, 1 nm.

Further, preferably, materials for forming the metallic thin film layer may have a resistivity smaller than 0.005, 0.002 or 0.001 Ω·m.

Further, a sheet resistance of the metallic thin film layer, which is fabricated with the microsphere photolithographic process, with an array of circular holes as the patterned structure is given by the following equation:

$$R_{sq} \approx \frac{\rho}{d}\left(1 - \frac{r}{R}\right)^{-1} \qquad \text{Equation (1)}$$

wherein $R_{sq}$ is the sheet resistance of the metallic thin film layer, ρ is the resistivity of the material for forming the metallic thin film layer, d is the thickness of the metallic thin film layer, R is the microsphere radius prior to the microsphere lithography and r is the microsphere radius after sphere reduction process. In this example, the microspheres are made from polystyrene. Alternatively, the microspheres may be made from any other suitable organic substances or materials known in the art, such as silicon dioxide. d has a value range of 5~1000 nm and R has a value range of 10 nm~10 μm, and r<R.

Performance of electrode samples 200-1 and 200-2 fabricated as mentioned above will be explained below.

For comparison, first, performance of the electrode sample without an array of circular holes, which has a film thickness of 22 nm and is made from gold, is measured to obtain a sheet resistance of 1 Ω/sq, which agrees well with the result calculated with resistivity 0.022 Ω·m of gold ($R_{sq}$=ρ/d=1 Ω/sq).

Then, according to the above Equation (1), the $R_{sq}$ of the electrode sample 200-1 may be obtained as 4.4 Ω/sq, and about 8 Ω/sq for $R_{sq}$ of the electrode sample 200-2, which agree well with the experimental results obtained by measuring electrode samples 200-1 and 200-2 formed as described above.

Figure 3:
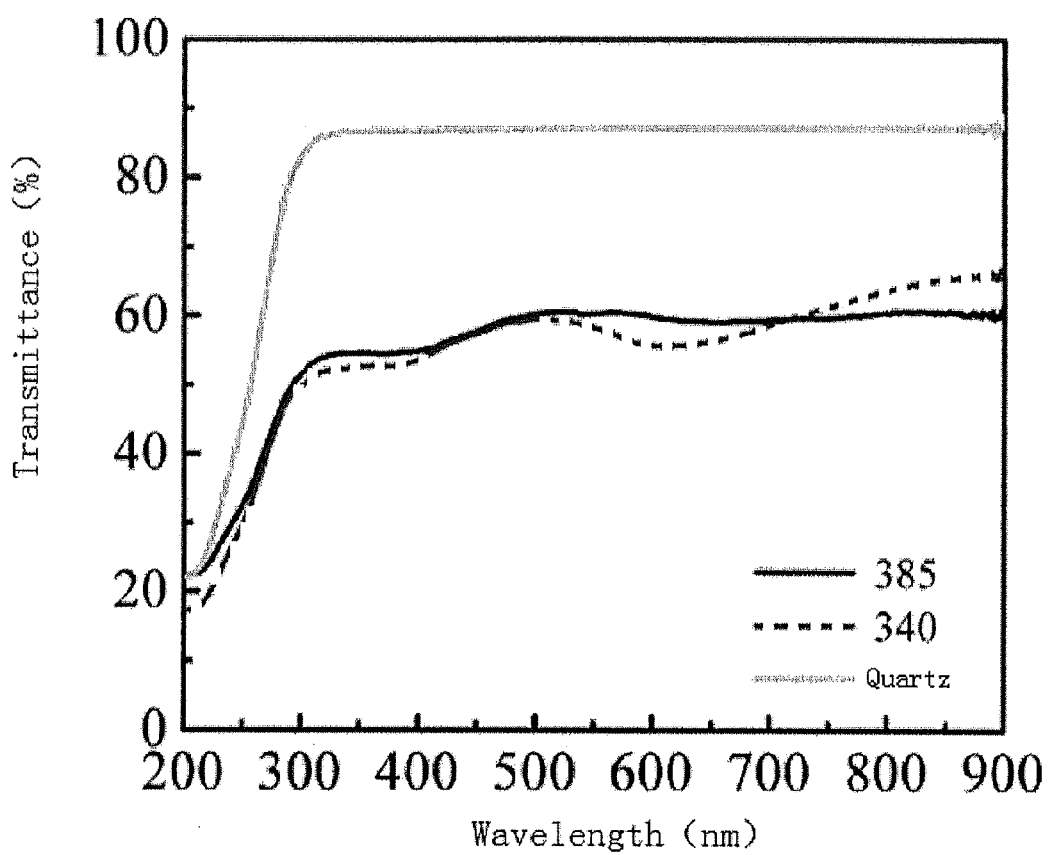
FIG. 3 shows a graph of transmittance of measured samples 1 and 2 (including quartz substrates) and quartz substrates versus light wavelength.

Further, optical characteristics of the electrode samples 200-1 and 200-2 fabricated as above may also be measured, and the obtained results are shown in FIG. 3.

In FIG. 3, the horizontal axis represents light wavelength, and the vertical axis represents transmittance. The gray line represents the graph of transmittance of the quartz substrate versus light wavelength, the dotted line represents the graph of transmittance of electrode sample 200-1 versus light wavelength, and the black line represents the graph of the transmittance of electrode sample 200-2 versus light wavelength. It is to be noted that the above-mentioned measurement results are those measured when both electrode samples 200-1 and 200-2 include quartz substrates. After the quartz substrates are removed, the obtained results should be better. As can be seen from these figures, after removing influence of the quartz substrate, the electrode sample 200-2 has a transmittance of about 70% and a sheet resistance of 8 Ω/sq. However, this is not the electrode sample with an optimal structure according to the first example.

Figure 4:
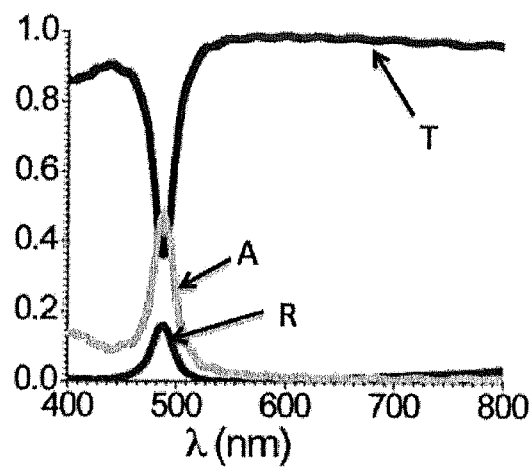
FIG. 4 shows a graph of transmittance (T), absorbance (A) and reflectance (R) of preferred sample 3 versus light wavelength, wherein Ag is used as material for fabricating the sample, polystyrene spheres have a radius R=220 nm prior to photolithography, polystyrene spheres have a radius R=211 nm after microsphere radius reducing process, and the planar metallic thin film layer has a film thickness d=40 nm.

FIG. 4 shows a graph of transmittance (T), absorbance (A) and reflectance (R) versus light wavelength of the electrode sample 400 with optimal structure according to the first example. The electrode sample 400 shown in FIG. 4 is made from Ag ($\rho=0.016$ Ω·m), the planar metallic thin film layer has a film thickness d=40 nm, the polystyrene spheres have a radius R=220 nm prior to lithography and a radius r=211 nm after reduction process. In such a case, the resulting sheet resistance is about 8 Ω/sq.

As can be seen from FIG. 4, in the wavelength range from 530 nm to 800 nm, the measured transmittance is almost 100%. Further, it is noted that in FIG. 4, although the deep intra-hole resonance exists at 480 nm wavelength, the wavelength at which the deep intra-hole resonance will be red shifted outside the wavelength range of interest by using an absorber having large dielectric constant (e.g., a-Si:H), which is known in the art. As can be seen from above, with the electrode's transmittance of T>97% and sheet resistance $R_s$, of about 8 Ω/sq in FIG. 4, the performance of the electrode in FIG. 4 is well above the performance of ITO.

Figure 5:
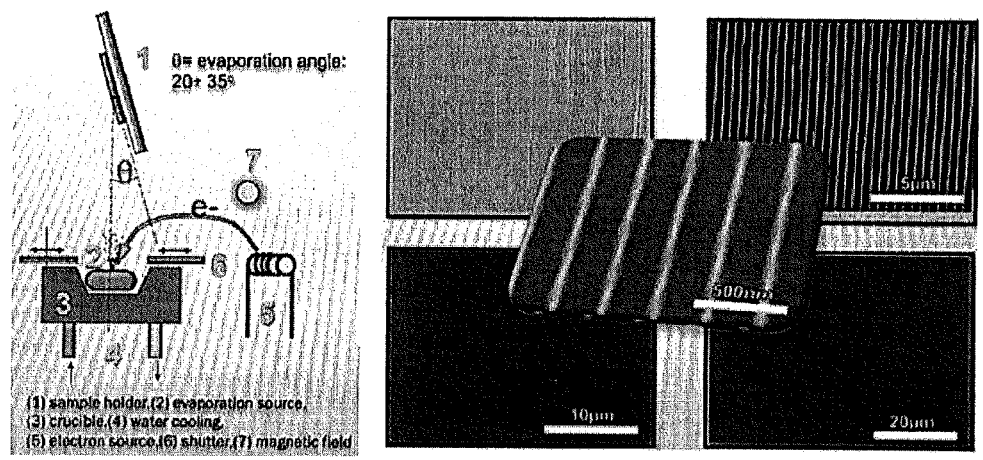
FIG. 5 shows a process of metal evaporation in fabrication with the microsphere photolithographic process and a SEM image of an electrode patterned into multiple parallel lines.

Further, in another example, the patterned structure may include a plurality of parallel lines. The right part of FIG. 5 shows a SEM image of the electrode according to the first example fabricated with the microsphere photolithographic process, wherein the patterned structure in the electrode is a plurality of lines parallel with the selected direction, which may be an anisotropic system. The left part in FIG. 5 shows the process of metal evaporation at a grazing angle from 20 to 35 degree when fabricating the metallic thin film layer in which the patterned structure is a plurality of parallel lines.

Figure 6:
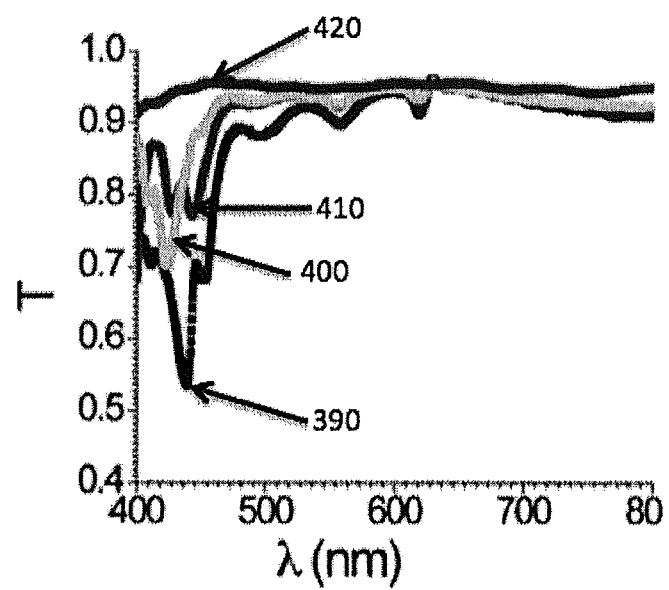
FIG. 6 shows a graph of transmittance versus light wavelength, in the case of having a substrate, when the patterned structure is crossing lines and the inter-line distance are 390, 400, 410 and 420 nm.

Further, the patterned structure may also include a plurality of crossed lines. FIG. 6 shows a graph of transmittance versus light wavelength when the patterned structure is crossed lines (i.e., square holes) with a substrate and the inter-line distance is 390, 400, 410 and 420 nm. In FIG. 6, the crossed lines are made from Ag with a film thickness of 40 nm. In such a case, for inter-line distances of 390, 400, 410 and 420 nm, corresponding sheet resistances are 9.3, 6.23, 4.68 and 3.74 Ω/sq, respectively.

Figure 7:
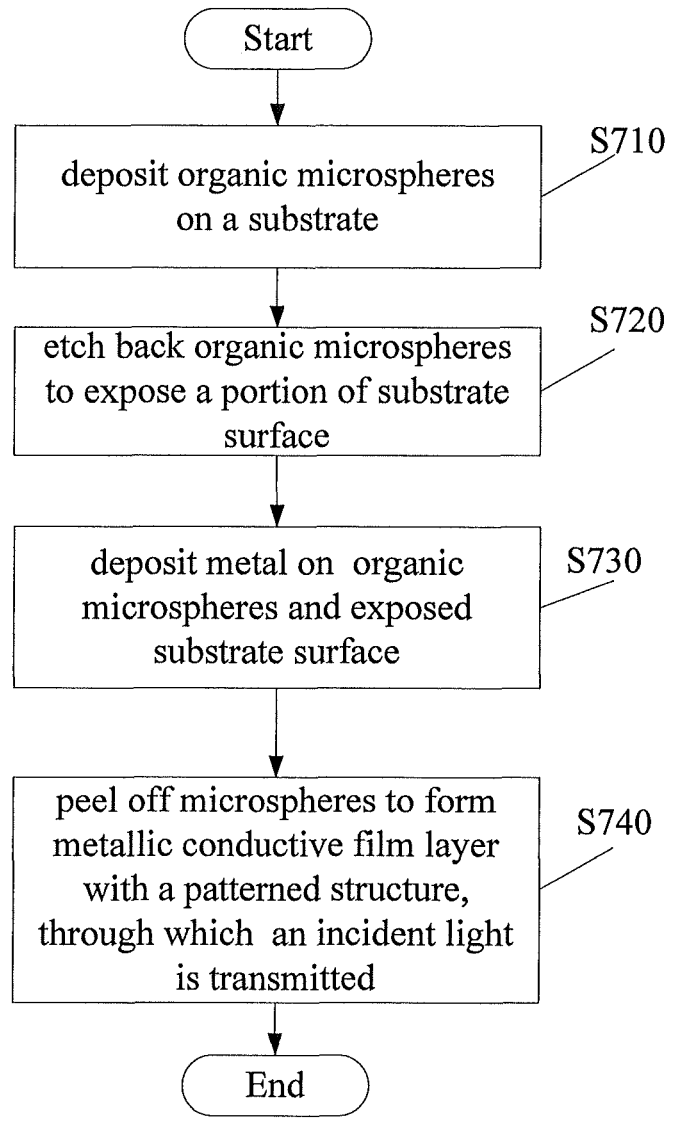
FIG. 7 shows a flow chart of the method for fabricating the electrode.

FIG. 7 shows a flow chart of a method for fabricating the electrode according to the first example. As shown in FIG. 7, first, in step S710, microspheres are deposited on a substrate. The substrate is, for example, a quartz substrate. In this example, the microspheres are made from polystyrene. In an alternative example, other suitable known materials such as silicon dioxide may be used.

Then, in step S720, the microspheres are subjected to an etching back process such as a reactive ion etching (RIE) process to expose a part of a surface of the substrate. Next, in step S730, metal is deposited on the microspheres and the exposed surface of the substrate. Then, in step S740, the microspheres are peeled off to form a metallic thin film layer with a patterned structure, wherein the metallic thin film layer is configured to transmit an incident light through the metallic thin film layer. It is to be noted that the patterned structure may be an array of circular holes, a plurality of parallel lines or a plurality of crossed lines.

Figure 8:
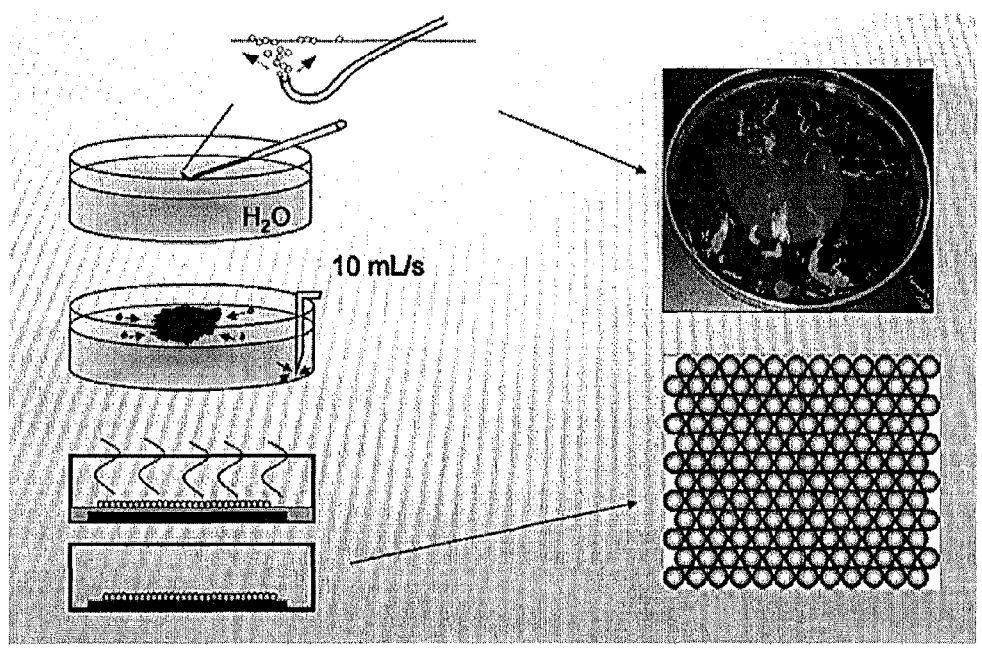
FIG. 8 shows a mask fabricating process in NSL.
Figure 9:
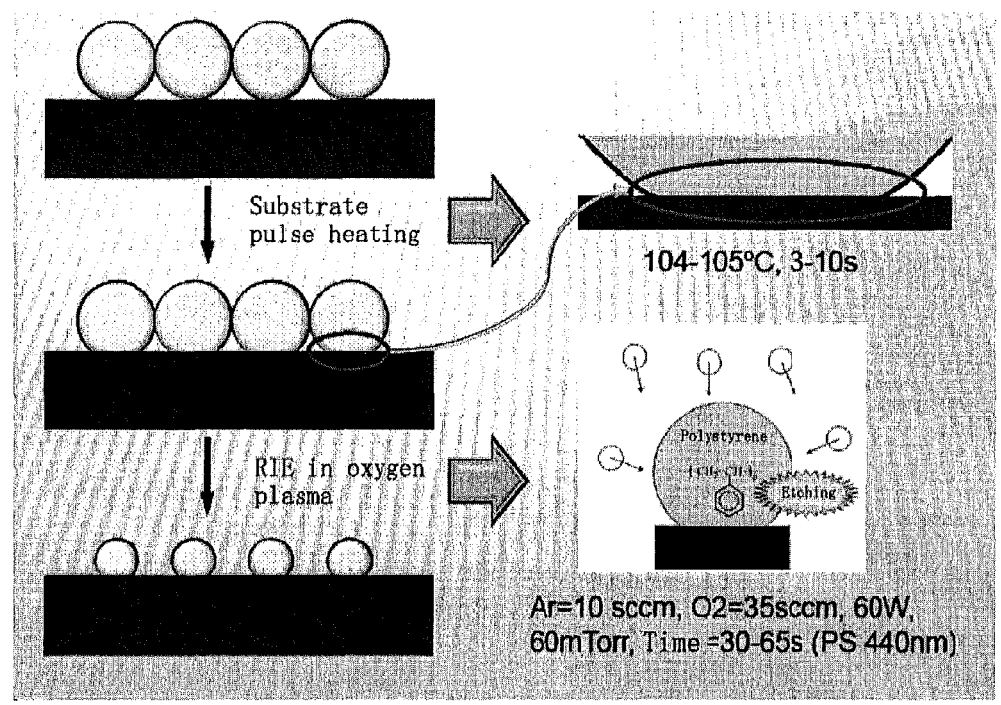
FIG. 9 shows an RIE process of the mask in FIG. 8.

FIG. 8 and FIG. 9 show a processing procedure when the patterned structure is an array of circular holes, which may, for example, use a nanosphere lithography (NSL) technology. FIG. 8 shows processing steps in the NSL process. As first shown in the left part of FIG. 8, polystyrene microspheres are deposited on water surface which then form a densely packed monolayer. After evaporating the water, an array of nanospheres deposits on a substrate. The deposited nanosphere array is then used as a mask for metal evaporation. The top diagram in the right part of FIG. 8 shows an optical image of the water surface with nanospheres floating on the water surface, and the bottom diagram shows the densely packed nanosphere array. The array pattern obtained as described above is that of isolated quasi-triangles, and thus non-conducting.

After obtaining a densely packed microsphere array as above and as shown in FIG. 9, the diameters of microspheres in the densely packed array are reduced by RIE. Thereafter, the array of microspheres with reduced diameters is used as a mask to evaporate metal. After completing metal evaporation, the microspheres are peeled off to form a metallic thin film layer with a patterned structure that is an array of circular holes.

When the patterned structure is a plurality of parallel lines or a plurality of crossed lines, the processing procedure is substantially identical to that of an array of circular holes, and the only difference lies in that the metal evaporation process is carried out with grazing angles from 20 to 35 degrees as shown in the left part of FIG. 5.

The structure and fabricating method of the electrode according to the first example have been described as above. With the electrode according to the first example, no transparent conductive oxide film or little transparent conductive oxide film may be used while fabricating the electrode and a piling process is not required, thereby preventing junction quality from deteriorating due to the piled conductive oxide thick film. Further, as can be seen in FIG. 4, properly designing the size and structure of the patterned structure in the electrode according to the first example may ensure that the electrode has a high conductivity and a high transmittance. In addition, the planar electrode may be used as a window superstrate, allowing for a high quality planar PV junction to be deposited over it.

THE SECOND EXAMPLE

The electrode and fabricating method thereof according to the second example will be described in detail below with reference to FIGS. 10 to 14.

Figure 10:
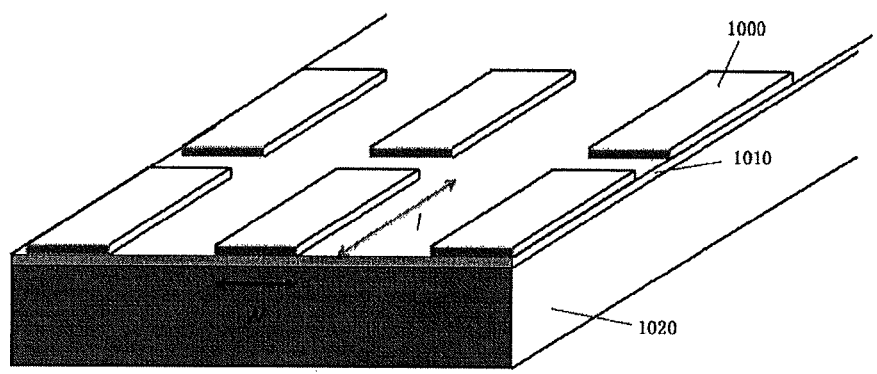
FIG. 10 shows an example of a diagram of a single-peak electrode.

FIG. 10 shows a structure diagram of a single-peak electrode 1000 according to the second example.

As shown in FIG. 10, the single-peak electrode 1000 according to the second example is laminated on a light absorption layer 1010, which is laminated on an underlying metal film 1020 such as the metal back electrode. The structure shown in FIG. 10 may be equivalent to a solar cell unit. The single-peak electrode 1000 includes a planar metallic thin film layer pattern including a first micro-strip array with a first size and a first shape. In such a case, the planar metallic thin film layer pattern is configured to transmit an incident light in a first wavelength range to the light absorption layer, wherein the first wavelength range is determined at least partly based on the first size and the first shape of the first micro-strip array.

In this example, the micro-strip is rectangularly shaped. Alternatively, the micro-strip may also take other proper shapes such as micro-strip holes or other forms of holes or islands.

The resonance relationship between the wavelength of light transmitted by the micro-strip and the size and shape of the micro-strip is given as the following:

$$l = s\frac{\lambda}{2n} \qquad \text{Equation (2)}$$

wherein l is the strip length, $\lambda$ is the wavelength of light transmitted by the strip, n is the refractive index of the light absorbing material and s is an arbitrary positive integer such as S=1, 2, 3, . . . .

Figure 11:
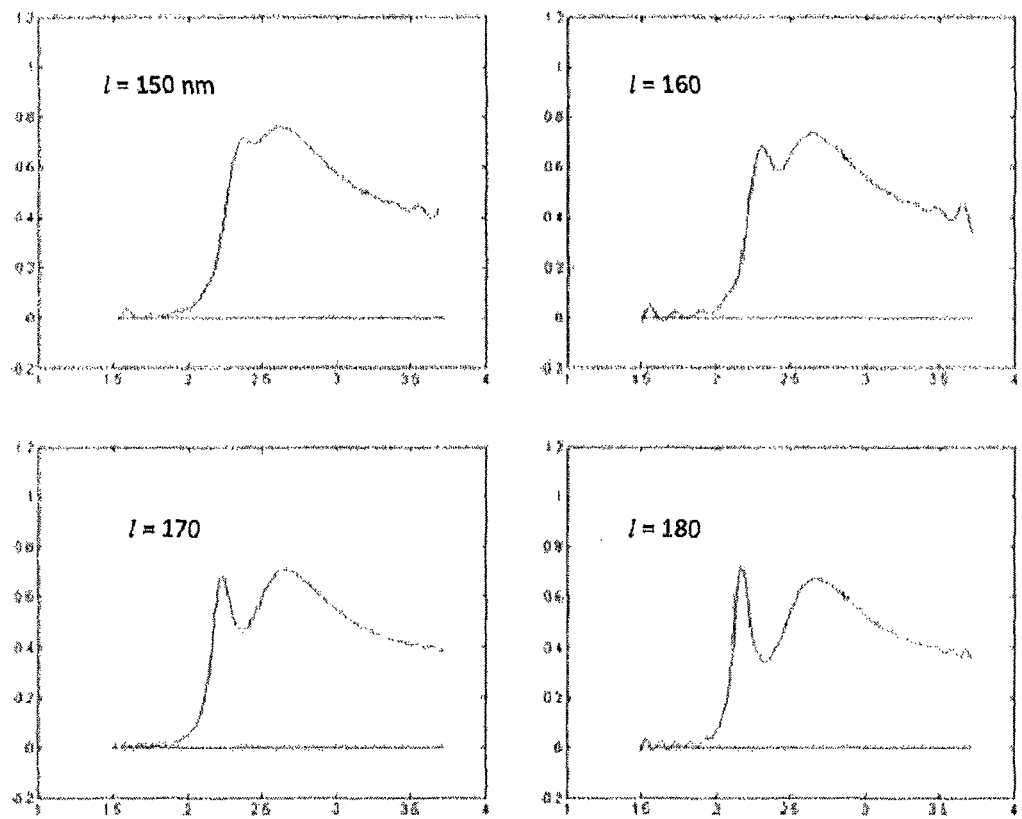
FIG. 11 shows a graph of absorbance versus light frequency for the single-peak electrode in FIG. 10 when the strip lengths are 150 nm, 160 nm, 170 nm and 180 nm respectively.

FIG. 11 shows a graph of absorbance and reflectance versus light frequency for the single-peak electrode in FIG. 10 when the strip lengths are 150 nm, 160 nm, 170 nm and 180 nm.

In FIG. 11, the horizontal axis represents frequency in eV and the vertical axis represents the percentage. As can be seen in FIG. 11, the broad absorption peak at 2.7 eV is due to the intrinsic inter-band absorption of a-Si. The satellite peak (e.g., the peak at 2.2 eV for 180 nm) represents the strip resonance, the relationship between its frequency (namely, wavelength) and strip length follows the above Equation (2). For a shorter l, corresponding absorption peak exists for s=1. As can be seen in FIG. 11, the absorption peak corresponds to an absorbance of about 70%, which is not ideal. However, the strip-to-strip distance may be reduced to improve the absorbance.

The light absorption material layer may include a PN junction, a PIN junction or a plurality of junctions. In one example, the light absorption material includes a photovoltaic material. In another example, the light absorption material includes one of Si, CIGS, CIS, CdTe, GaAs, $Cu_2O$, $Zn_3P_2$ and SiC. The light absorption layer may also be a quantum dot layer. Alternatively, the light absorption layer may be a organic semiconductor film, such as PF10TBT:[C60] PCBM.

The underlying metal film may or may not be patterned.

Further, the planar metallic film layer has a surface roughness less than 1 μm, 100 nm, 10 nm or 1 nm. The material for forming the planar metallic thin film layer has a resistivity less than 0.005, 0.002 or 0.001 Ω·m.

Figure 12:
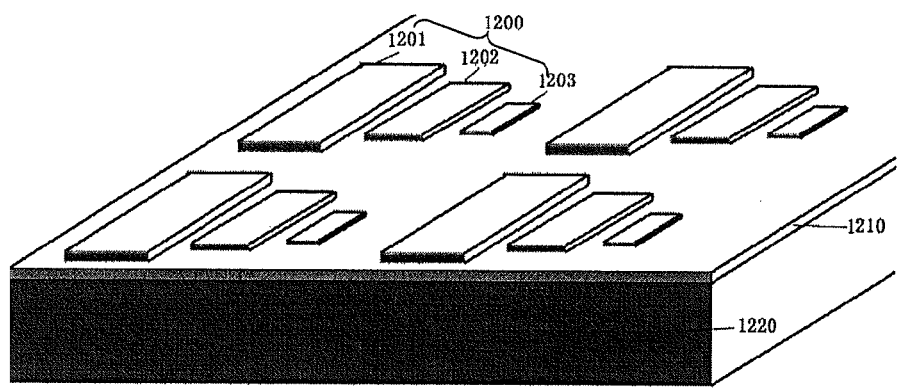
FIG. 12 shows a diagram of a three-peak electrode.

In another example, the electrode according to the second example may be a multi-peak electrode. FIG. 12 shows the 3-peak electrode 1200 according to the second example in which, in addition to the first micro-strip array 1201 with the first size and the first shape, the planar metallic thin film pattern 1200 may further include a second micro-strip array 1202 with a second size and a second shape and a third micro-strip array 1203 with a third size and a third shape, wherein the planar metallic thin film layer pattern is configured to not only transmit a light of the first wavelength range into the light absorption layer, but also transmit an incident light of a second and third wavelength range into the light absorption layer. The second wavelength range is determined at least partly based on the second size and the second shape of the second micro-strip array, and the third wavelength range is determined at least partly based on the third size and the third shape of the third micro-strip array. Likewise, the 3-peak electrode 1200 is laminated on the light absorption layer 1210, and the light absorption layer 1210 is laminated on the underlying metal film 1220, such as the metallic back electrode.

Figure 13:
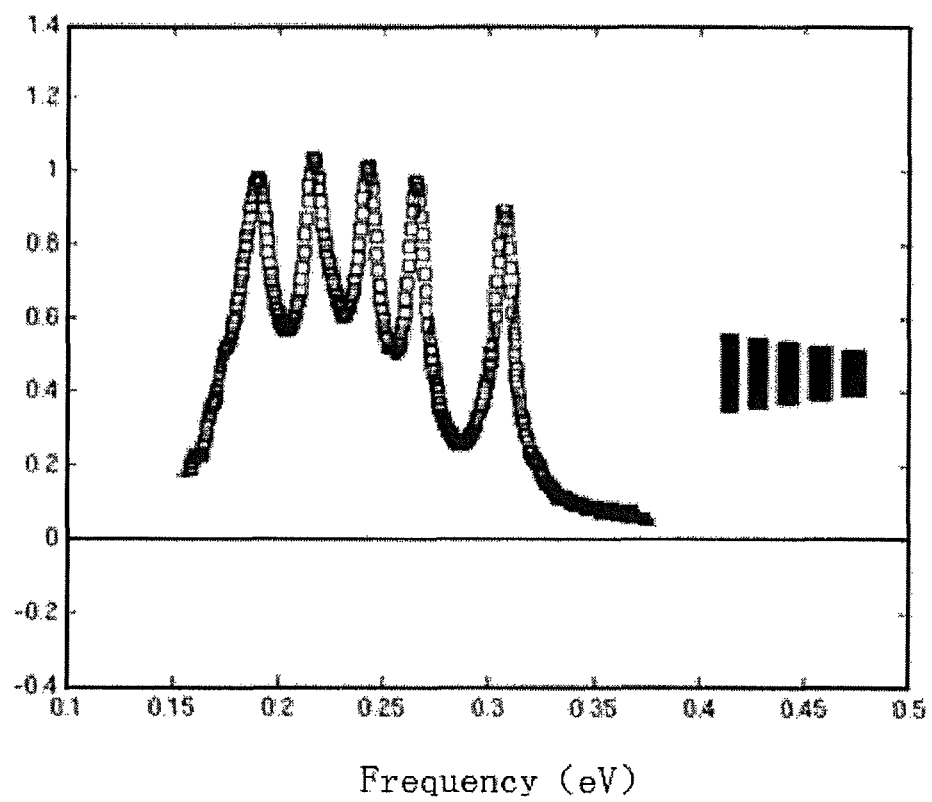
FIG. 13 shows a graph of absorbance versus light frequency for a 5-peak electrode.

Further, the electrode according to the second example may be a 5-peak electrode. FIG. 13 shows a graph of absorbance versus light frequency of the 5-peak electrode according to the second example which operates under an infrared light.

In FIG. 13, the 5-peak electrode has 5 microstrip elements with different sizes such as lengths, and each peak corresponds to one microstrip element with a given length. In this scheme, low loss dielectric is used as the absorber for obtaining a very narrow absorption peak. Such light absorption may be realized in the visible light frequency range.

Figure 14:
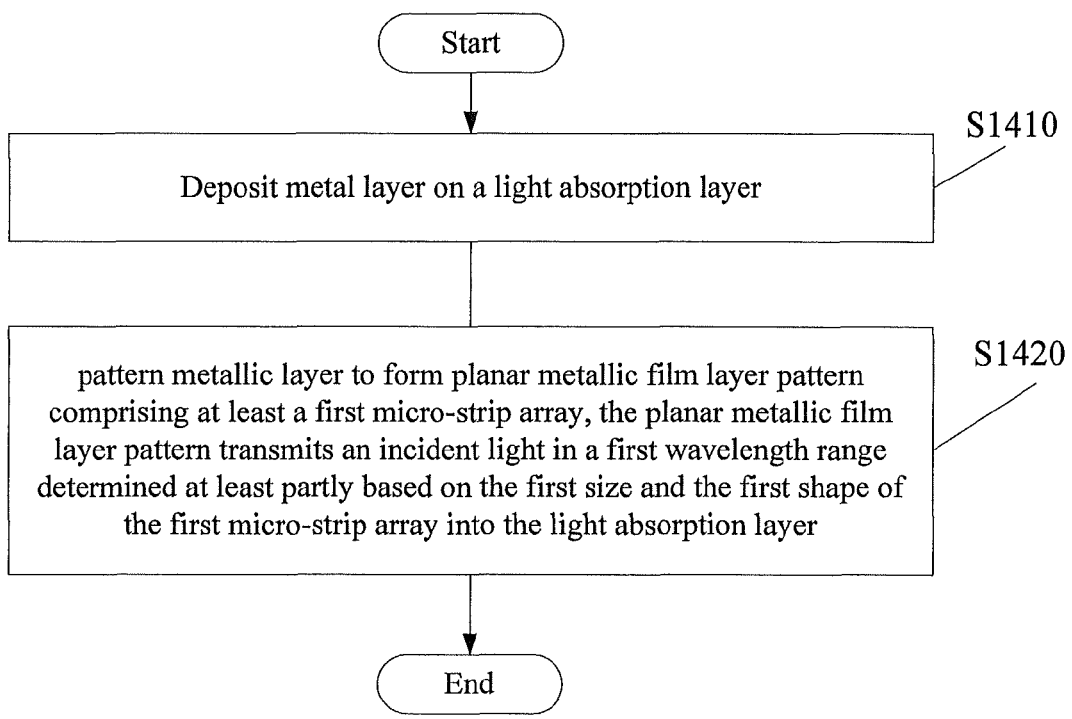
FIG. 14 shows a flow chart of a method for fabricating an electrode.

FIG. 14 shows a flow chart of a method for fabricating the electrode according to the second example. As first shown in FIG. 14, in step S1400, a metal layer is deposited on a light absorption layer. Then, in step S1410, a metallic layer is patterned to form a planar metallic thin film layer pattern at least including a first micro-strip array with a first size and a first shape, wherein the planar metallic film layer is configured to transmit an incident light in a first wavelength range into the light absorption layer, and wherein the first wavelength range is determined at least partly based on the first size and the first shape of the micro-strip array.

The structure and fabricating method of the electrode according to the second example has been described as above with reference to FIGS. 10 to 14. With the electrode according to the second example, texturing of back electrodes may not be required in fabricating solar cells.

It is to be noted that electrodes according to various examples may be applicable not only to photovoltaic applications, i.e., solar cells, but also to optoelectronic applications such as LEDs.

While our electrodes and methods have been disclosed with respect to preferred examples illustrated and described in detail, it is apparent to those skilled in the art that various modifications and variations may be made. Therefore, it is intended that this disclosure cover various modifications and variations as long as they fall within the scope of the appended claims and their equivalents.

What is claimed is:

1. An electrode laminated on a light absorption layer, comprising:
   a planar metallic thin film layer pattern comprising at least a first micro-strip array with a first size and a first shape, wherein 1) the planar metallic thin film layer pattern is configured to transmit an incident light in a first wavelength range into the light absorption layer, and 2) the first wavelength range is determined at least partly based on the first size and the first shape of the first micro-strip array.

2. The electrode of claim 1, wherein the planar metallic thin film layer pattern further comprises a second micro-strip array with a second size and a second shape, and a third micro-strip array with a third size and a third shape, wherein 1) the planar metallic thin film layer pattern is configured to transmit an incident light in a second wavelength range and an incident light in a third wavelength range into the light absorption layer, and 2) the second wavelength range is determined at least partly based on the second size and the second shape of the second micro-strip array, and the third wavelength range is determined at least partly based on the third size and the third shape of the third micro-strip array.

3. The electrode of claim 1, wherein the planar metallic thin film layer pattern has a light transmittance greater than 90% in the transmission range.

4. The electrode of claim 1, wherein the light absorption material layer comprises a PN junction, a PIN junction or a plurality of junctions.

5. The electrode of claim 1, wherein the light absorption material comprises a photovoltaic material.

6. The electrode of claim 1, wherein the light absorption material is selected from the group consisting of Si, CIGS, CIS, CdTe, GaAs, $Cu_2O$, $Zn_3P_2$ and SiC.

7. The electrode of claim 1, wherein the micro-strip is rectangularly shaped.

8. The electrode of claim 1, wherein the planar metallic thin film layer pattern is transmittable for a visible light, a near infrared light or an infrared light.

9. The electrode of claim 1, wherein the planar metallic thin film layer has a surface roughness less than 1 μ, 100nm, 10nm or 1nm.

10. The electrode of claim 1, wherein the material for forming the planar metallic thin film layer has a resistivity less than 0.005 , 0.002 or 0.001 Ω·m.

11. The electrode of claim 1, wherein a resonance relationship between the wavelength of light transmitted by the micro-strip and the size and shape of the micro-strip is given by:

$$l = s\frac{\lambda}{2n}$$

wherein, l is strip length, λ is a wavelength of light transmitted by the strips, n is a refractive index of the light absorption material, and s is an arbitrary positive integer.

* * * * *